United States Patent
Hao et al.

(10) Patent No.: US 7,989,853 B2
(45) Date of Patent: Aug. 2, 2011

(54) INTEGRATION OF HIGH VOLTAGE JFET IN LINEAR BIPOLAR CMOS PROCESS

(75) Inventors: Pinghai Hao, Plano, TX (US); Sameer Pendharkar, Allen, TX (US); Philip L. Hower, Concord, MA (US); Marie Denison, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 250 days.

(21) Appl. No.: 12/537,589

(22) Filed: Aug. 7, 2009

(65) Prior Publication Data
US 2010/0032729 A1 Feb. 11, 2010

Related U.S. Application Data

(60) Provisional application No. 61/087,051, filed on Aug. 7, 2008.

(51) Int. Cl.
*H01L 29/66* (2006.01)
*H01L 21/337* (2006.01)

(52) U.S. Cl. ............. 257/272; 257/E29.242; 257/E21.4; 438/195

(58) Field of Classification Search .................. 257/107, 257/133, 139–145, 213, 256–287, E29.242, 257/E29.255, E29.264, E29.265, E21.4, E21.445, 257/E21.446, E21.447, E21.448, E21.449; 438/133–140, 142, 186–196
See application file for complete search history.

(56) References Cited

U.S. PATENT DOCUMENTS
2005/0173726 A1* 8/2005 Potts ............................ 257/134
* cited by examiner

*Primary Examiner* — Ha Tran T Nguyen
*Assistant Examiner* — Kevin Quinto
(74) *Attorney, Agent, or Firm* — Jacqueline J. Garner; Wade J. Brady, III; Frederick J. Telecky, Jr.

(57) ABSTRACT

A dual channel JFET which can be integrated in an IC without adding process steps is disclosed. Pinch-off voltage is determined by lateral width of a first, vertical, channel near the source contact. Maximum drain voltage is determined by drain to gate separation and length of a second, horizontal, channel under the gate. Pinch-off voltage and maximum drain potential are dependent on lateral dimensions of the drain and gate wells and may be independently optimized. A method of fabricating the dual channel JFET is also disclosed.

18 Claims, 5 Drawing Sheets

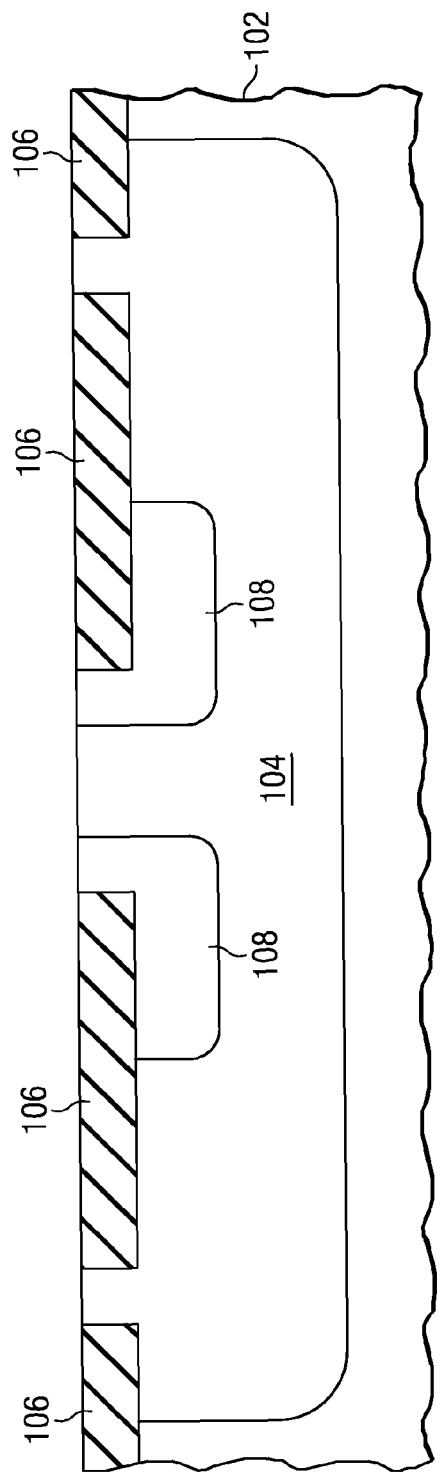
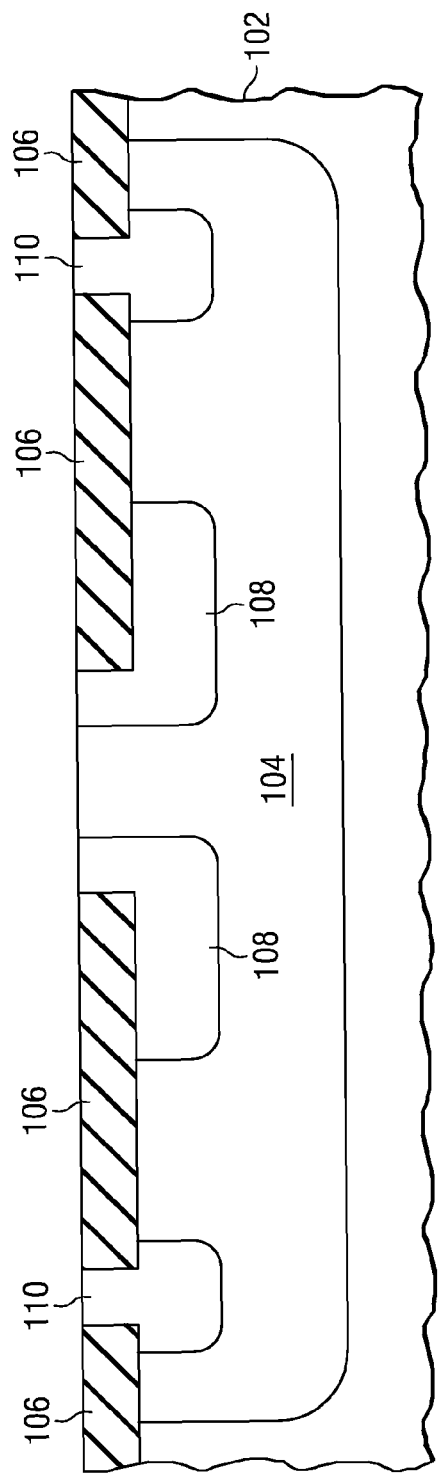

INTEGRATION OF HIGH VOLTAGE JFET IN LINEAR BIPOLAR CMOS PROCESS

FIELD OF THE INVENTION

This invention relates to the field of integrated circuits. More particularly, this invention relates to junction field effect transistors in integrated circuits.

BACKGROUND OF THE INVENTION

Junction field effect transistors (JFETs) in integrated circuits (ICs) provide a low noise current modulation capability that is important for many analog circuits. The JFET pinch-off voltage, analogous to the threshold voltage of a metal oxide semiconductor (MOS) transistor, decreases as gate junction spacing decreases, which in turn decreases the JFET maximum drain voltage. Thus, pinch-off voltage is commonly balanced against the maximum drain voltage in circuit performance. Moreover, pinch-off voltage and maximum drain voltage depend on diffused junction depths, and exhibit consequential variability across an IC, and from IC to IC.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a dual channel JFET which can be integrated in an integrated circuit without adding process steps, such that pinch-off voltage and maximum drain potential are dependent on lateral feature dimensions of the drain and gate wells and may be independently optimized to meet the requirements of the circuit in which the dual channel JFET is used. Pinch-off voltage is determined by lateral width of a vertical channel and maximum drain voltage is determined by drain to gate separation and a length of a horizontal channel. Additional dual channel JFETs may be built in an integrated circuit with different pinch-off voltages and different maximum drain potentials.

DESCRIPTION OF THE VIEWS OF THE DRAWING

FIG. 1A through FIG. 1G are cross-sections of an IC including a JFET formed according to a first embodiment of the instant invention, in successive stages of fabrication.

DETAILED DESCRIPTION

Figure 1A:
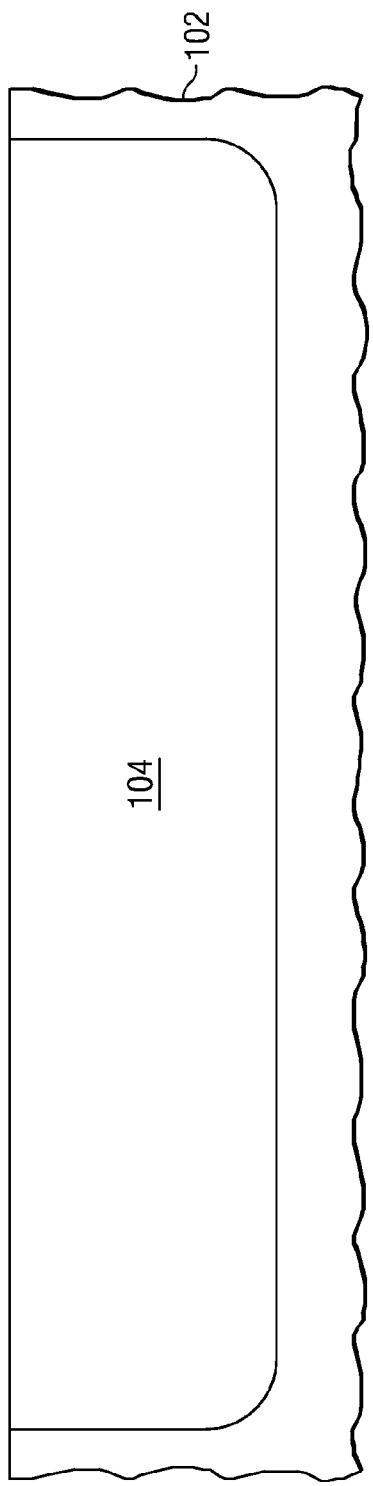

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for a junction field effect transistor (JFET) in an integrated circuit (IC) with independently variable pinch-off voltage and maximum drain voltage is addressed by the instant invention, which provides a dual channel JFET in which pinch-off voltage is determined by a vertical channel and maximum drain voltage is determined by a horizontal channel.

FIG. 1A through FIG. 1G are cross-sections of an IC including a JFET formed according to a first embodiment of the instant invention, in successive stages of fabrication. Referring to FIG. 1A, the IC 100 is fabricated on a semiconductor substrate 102, typically a single crystal silicon wafer, commonly having a top layer of p-type epitaxial silicon or silicon-germanium, with an electrical resistivity between 1 and 100 ohm-cm. A deep n-type well, 104, commonly known as a deep n-well, is formed in the substrate 102 in a region defined for the inventive dual channel JFET. The deep n-well 104 is typically formed by ion implanting a first set of n-type dopants, commonly phosphorus, and possibly arsenic and/or antimony, at a total dose between $3 \cdot 10^{11}$ and $3 \cdot 10^{13}$ atoms/cm$^2$, into the substrate 102, followed by an anneal process which diffuses and activates the first set of n-type dopants in the substrate 102 to form a continuous n-type region from a top surface of the substrate 102 to a typical depth of 3 to 5 microns with an average dopant density between $3 \cdot 10^{15}$ atoms/cm$^{-3}$ and $8 \cdot 10^{15}$ atoms/cm$^{-3}$. A deep n-well photoresist pattern, not shown in FIG. 1A for clarity, is formed on the top surface of the substrate to block the first set of n-type dopants from regions outside the deep n-well.

Figure 1B:
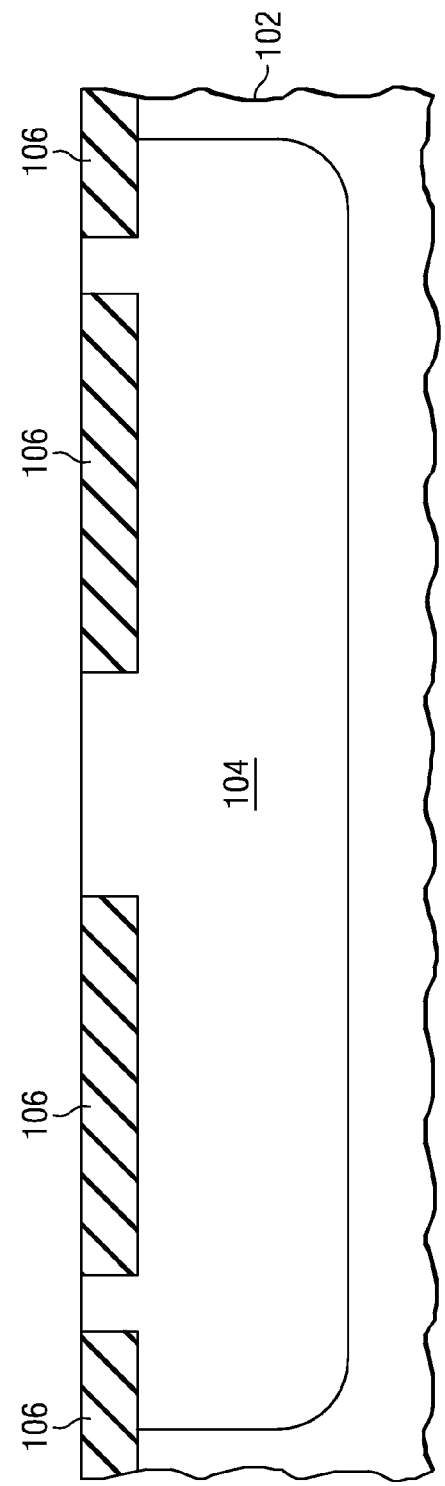

FIG. 1B depicts the IC 100 after formation of elements of field oxide 106 at the top surface of the substrate 102. Field oxide is typically silicon dioxide between 250 and 600 nanometers thick, preferably formed by shallow trench isolation (STI) processes, or alternatively by local oxidation of silicon (LOCOS) processes. In STI processes, trenches, commonly 250 to 500 nanometers deep, are etched into the IC 100, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as a high aspect ratio process (HARP). Elements of field oxide 106 overlap edges of the deep n-well 104 on all sides, including edges out of the plane of FIG. 1B.

FIG. 1C shows the IC 100 after formation of shallow p-type well regions 108, commonly known as p-wells, in the deep n-well 104, typically by ion implanting a first set of p-type dopants, including boron and possibly gallium and/or indium, at doses from $1 \cdot 10^{11}$ to $1 \cdot 10^{14}$ atoms/cm$^2$, into a region defined for a gate of the dual channel JFET. A p-well photoresist pattern, not shown in FIG. 1C for clarity, is commonly used to block the first set of p-type dopants from regions outside the dual channel JFET gate. The p-well 108 extends from a top surface of the substrate 102 to a depth typically 50 to 2000 nanometers below a bottom surface of the field oxide elements 106. A sheet resistivity of the p-well 108 is commonly between 100 and 1000 ohms/square. In one realization of the instant embodiment, boron may be implanted in four sub-implants, a first sub-implant of $2 \cdot 10^{12}$ atoms/cm$^2$ at an energy of 20 keV, a second sub-implant of $7 \cdot 10^{12}$ atoms/cm$^2$ at an energy of 70 keV, a third sub-implant of $8 \cdot 10^{12}$ atoms/ cm² at an energy of 140 keV, and a fourth sub-implant of $3 \cdot 10^{13}$ atoms/cm² at an energy of 375 keV, to produce shallow p-well regions 108 with a depth between 1600 and 2000 nanometers and a peak doping density of approximately $2 \cdot 10^{18}$ atoms/cm³ at a depth of approximately 1500 nanometers. The regions defined for the p-wells 108 commonly include regions defined FIG. 1D shows the IC 100 after formation of shallow n-type well regions 110, commonly known as n-wells, in the deep n-well 104, typically by ion implanting a second set of n-type dopants, including phosphorus and arsenic, and possibly antimony, at doses from $1 \cdot 10^{11}$ to $1 \cdot 10^{14}$ atoms/cm², into a region defined for drain nodes of the dual channel JFET transistor. An n-well photoresist pattern, not shown in FIG. 1D for clarity, is commonly used to block the second set of n-type dopants from regions outside the dual channel JFET drain nodes. The n-wells 110 extend from the top surface of the substrate 102 to a depth typically 50 to 2000 nanometers below the bottom surface of the field oxide elements 106. The regions defined for the n-wells 110 commonly include regions defined for p-channel MOS (PMOS) transistors, and the ion implantation process to form the n-wells 110 may include additional steps to implant additional n-type dopants at various depths for purposes of improving PMOS transistor performance, such as threshold adjustment, leakage current reduction and suppression of parasitic bipolar operation. A sheet resistivity of the n-well 110 is commonly between 100 and 1000 ohms/square.

Figure 1E:
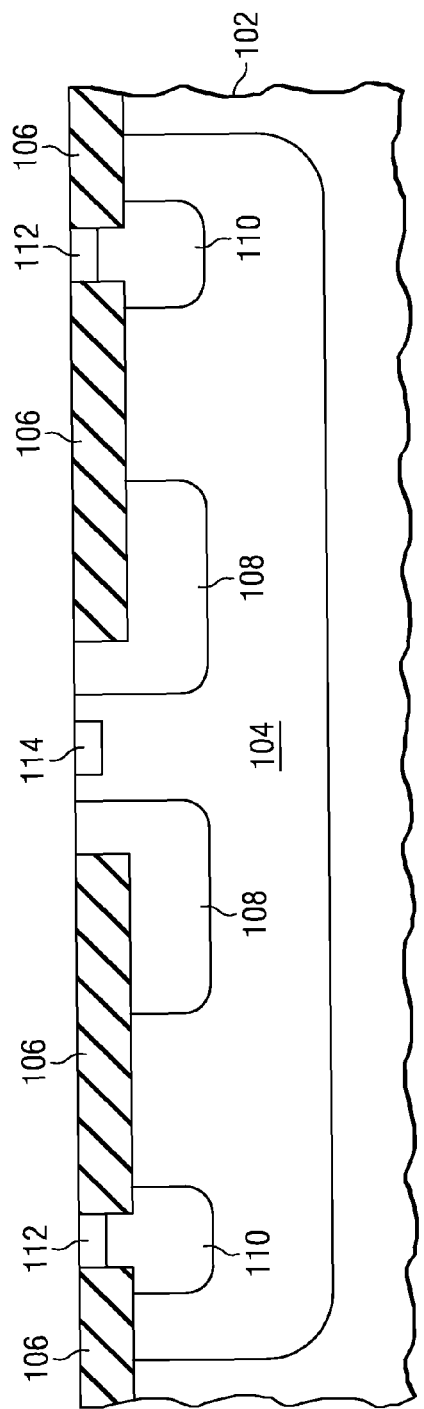

FIG. 1E shows the IC 100 after formation of n-type drain contact regions 112 and an n-type source contact region 114 at the top surface of the substrate 102 in the n-wells 110 and the deep n-well 104, respectively. The n-type drain contact regions 112 and n-type source contact region 114 are typically formed by ion implanting a third set of n-type dopants, preferably phosphorus and arsenic, and possibly antimony, at a total dose between $5 \cdot 10^{14}$ to $5 \cdot 10^{16}$ atoms/cm², with energies between 1 and 20 keV, followed by a anneal process, preferably a rapid thermal process (RTP anneal or an ultra high temperature (UHT) anneal, to activate a portion of the third set of n-type dopants while minimizing diffusion of the dopant atoms. In a preferred embodiment, there exists at least 100 nanometers of lateral separation between the n-type source contact region 114 and the p-wells 108.

Optional p-type diffused contact regions in the p-wells 108 may be formed to reduce electrical resistance to the p-wells 108. The optional p-type diffused contact regions are not shown in FIG. 1E for clarity.

Figure 1F:
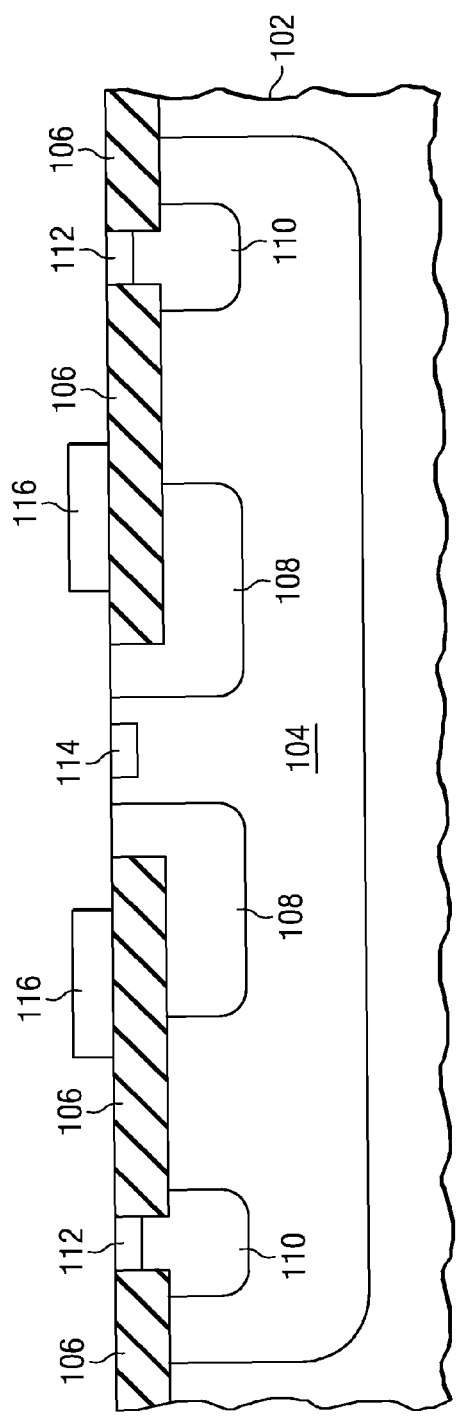

FIG. 1F shows the IC 100 after formation of a field plate 116 on a top surface of the field oxide 106 straddling an exterior boundary of the p-wells 108 with the deep n-well 104. The field plate 116 typically overlaps the p-well 108 by at least 1 micron, and overlaps the deep n-well by at least 2 microns. The field plate 116 is preferably made of polycrystalline silicon, commonly called polysilicon, and is typically formed by depositing a layer of polysilicon on the top surface of the field oxide, forming a field plate photoresist pattern to define the field plate region, and removing unwanted polysilicon by known etching methods. The field plate is commonly formed by process operations used to form gates of MOS transistors in the IC 100. It is within the scope of this invention to form the field plate 116 of any conductive material.

Optional layers of metal silicide, such as nickel silicide, cobalt silicide or titanium silicide, may be formed on top surfaces of the n-type drain contact regions 112, field plate 116, p-wells 108 and n-type source contact region 114 to reduce electrical resistance to these elements. If metal silicide layers are formed, a patterned silicide block layer must be formed, using known methods, to prevent short circuiting the n-type source contact region 114 to the p-wells 108. Metal silicide layers are not shown in FIG. 1F for clarity.

Figure 1G:
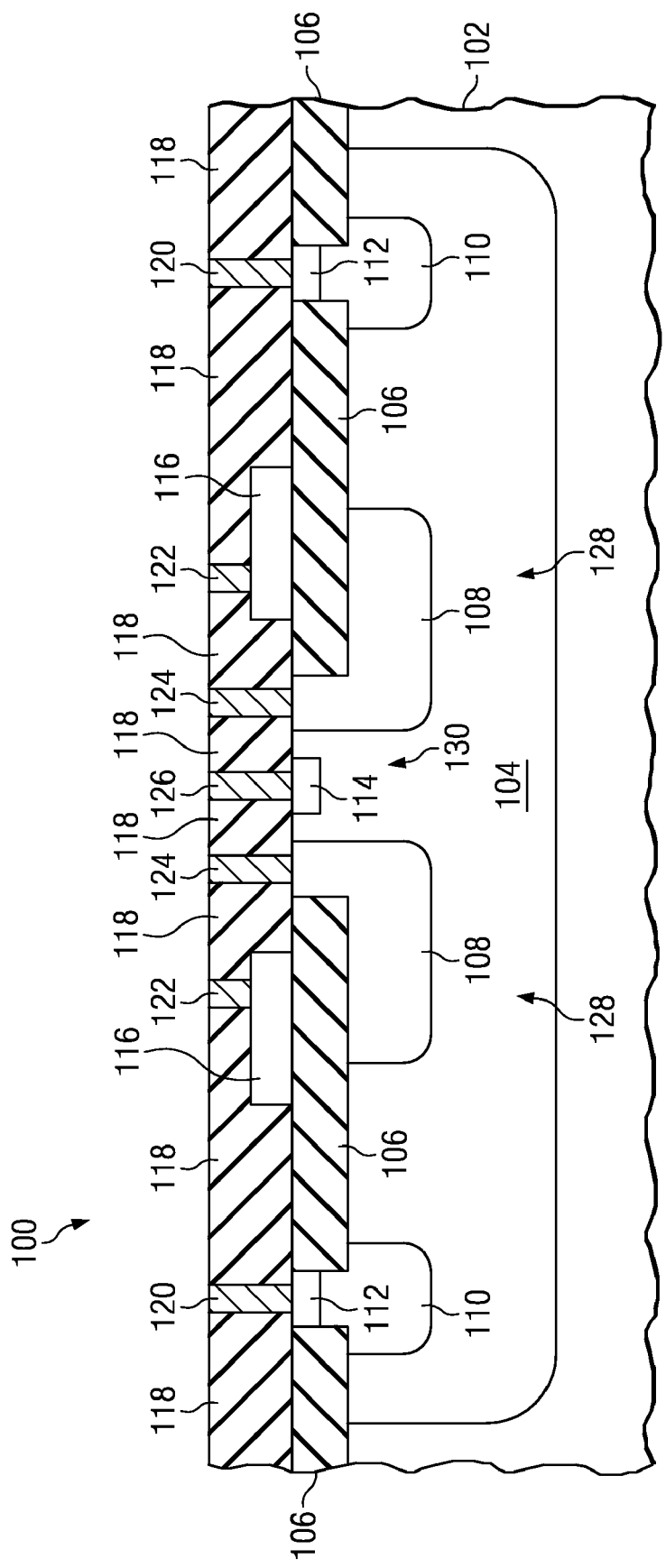

Referring to FIG. 1G, fabrication of the IC 100 continues with formation of a pre-metal dielectric layer (PMD) 118, typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, formed on the top surface of the field oxide 106, field plate 116, n-type drain contact regions 112, n-type source contact region 114, p-wells 108 and deep n-well 104.

Continuing to refer to FIG. 1G, drain contacts 120, field plate contacts 122, gate contacts 124 and a source contact 126 are formed in the PMD 118 to make electrical contact to the n-type drain contact regions 112, field plate 116, p-wells 108 and n-type source contact region 114, respectively. Contacts 120, 122, 124, 126 are formed by forming a contact photoresist pattern on a top surface of the PMD 118 to expose regions for contacts, removing PMD material in the contact regions by known etching methods to expose the n-type drain contact regions 112, field plate 116, p-wells 108 and n-type source contact region 114, and filling the etched contact regions with metal, typically tungsten, to the top surface of the PMD 118.

During operation of the dual channel JFET in the instant embodiment, the source contact 126 is connected to a source potential, typically ground, the drain contacts 120 are connected to a drain potential, typically between 10 and 120 volts, the gate contacts 124 are connected to a gate potential between the source potential and 2 or 3 volts above the source potential, and the field plate contacts 122 are connected to a field plate potential, commonly the same as the gate potential. Drain current flows serially through a first n-channel 128, which lies in the deep n-well 104 between the p-wells 108 and a bottom surface of the deep n-well 104, and a second n-channel 130, which lies in the deep n-well 104 between the p-wells 108. A depletion region exists in the deep n-well 104 between the n-wells 110 and the p-wells 108 and the p-type substrate 102. Characteristics of the depletion region, such as a maximum electric field and a breakdown potential, are a function of a lateral spacing between the n-wells 110 and the p-wells 108, and a width of the p-wells 108, both of which are well controlled by the n-well and p-well photoresist patterns used to define regions for ion implantation of the second set of n-type dopants and the first set of p-type dopants. A pinch-off voltage is determined by a doping density of the deep n-well 104 in the second n-channel 130 and a lateral spacing between the p-well regions 108 on either side of the second n-channel 130. In one realization of the instant embodiment, a deep n-well 104 may be formed with a doping density of approximately $5 \cdot 10^{15}$ atoms/cm³ in a substrate 102 with a doping density of approximately $1 \cdot 10^{15}$ atoms/cm³. Shallow p-well regions 108 with a depth between 1600 and 2000 nanometers and a peak doping density of approximately $2 \cdot 10^{18}$ atoms/cm³ at a depth of approximately 1500 nanometers may be formed in the deep n-well 104 so as to form a first n-channel 128 with a depth between 2000 and 4000 nanometers. The JFET of the instant realization may be operated at a drain potential of 100 volts. A second n-channel of the instant realization may have a doping density of approximately $5 \cdot 10^{15}$ atoms/cm$^3$ and a width of approximately 1800 nanometers, and exhibit a pinch-off voltage on approximately 1.1 volts.

The maximum drain potential is determined by the breakdown potential, and is largely independent of the pinch-off voltage. This is advantageous because a dual channel JFET may be designed to optimize maximum drain potential and pinch-off voltage separately according to the requirements of the circuit in which it is used. Control of breakdown potential by lateral dimensions defined by photoresist patterns is furthermore advantageous because variability of breakdown potential is reduced compared to other JFET configurations. Similarly, control of pinch-off voltage by lateral dimensions defined by photoresist patterns is furthermore advantageous because variability of pinch-off voltage is reduced compared to other JFET configurations. Orientation of the second n-channel in a vertical configuration is advantageous because it reduces a lateral size of the dual channel JFET compared to other JFET configurations with equivalent maximum drain potential and pinch-off voltage. Dependence of the maximum drain potential and pinch-off voltage on lateral dimensions defined by photoresist patterns is also advantageous because additional dual channel JFETs with different maximum drain potentials and/or pinch-off voltages may be formed in an IC without added fabrication cost or complexity.

Figure 2:
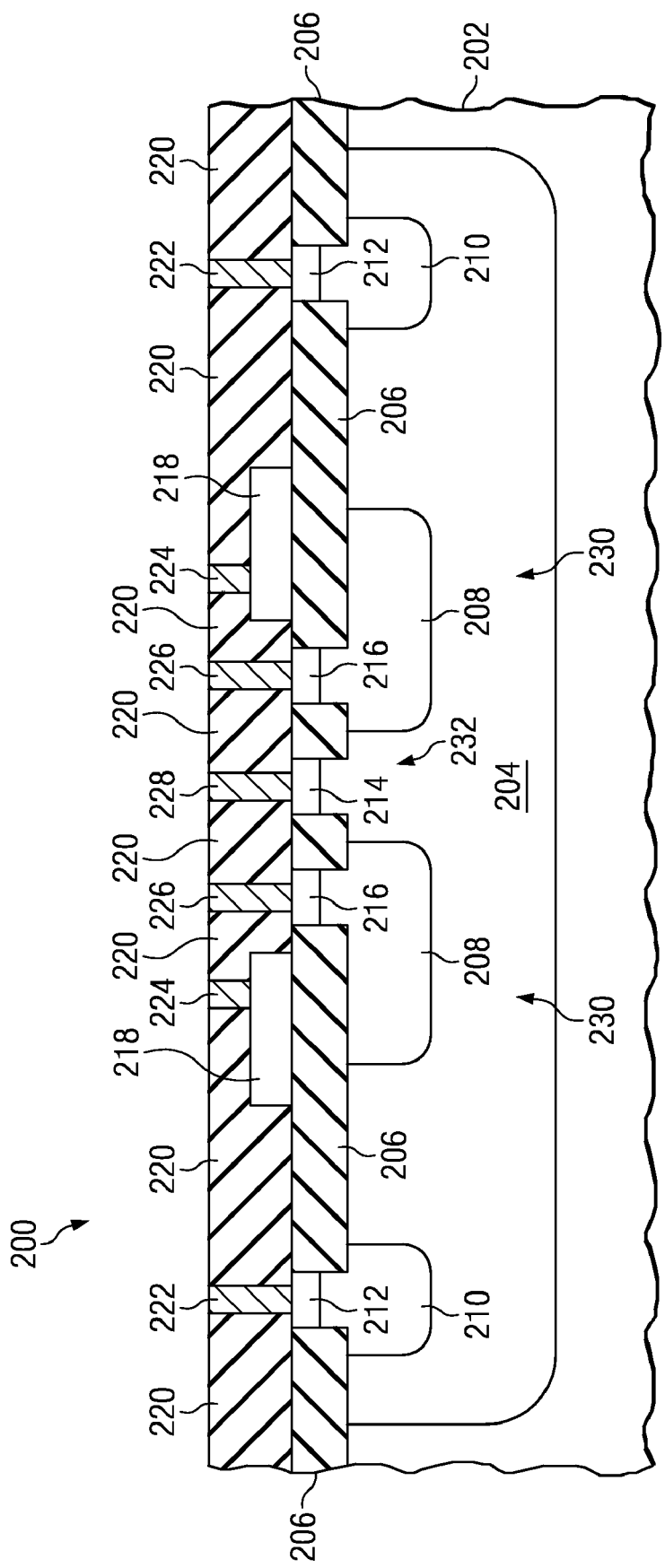
FIG. 2 is a cross-section of a dual channel JFET formed according to an alternate embodiment of the instant invention.

FIG. 2 is a cross-section of a dual channel JFET formed according to an alternate embodiment of the instant invention. An IC 200 is fabricated on a p-type substrate 202. A deep n-well 204 is formed in the substrate 202. Elements of field oxide 206 are formed at a top surface of the substrate 202 overlapping edges of the deep n-well 204, with openings for a source region, gate contact regions and drain contact regions. P-wells 208 are formed in the deep n-well 204 flanking the source region and underlapping the gate contact openings in the field oxide 206. N-wells 210 are formed in the deep n-well 204 under the drain contact openings in the field oxide 206. N-type drain contact regions 212 are formed in the drain contact openings in the field oxide 206. An n-type source contact region 214 is formed in the deep n-well 204 at the top surface of the source region. P-type gate contact regions 216 are formed in the p-wells 208 in the gate contact openings in the field oxide 206. A field plate 218 is formed on a top surface of the field oxide 206 straddling an exterior boundary between the p-wells 208 and the deep n-well 204. A PMD 220 is formed on top surfaces of the field plate 218, field oxide 206, n-type drain contact regions 212, n-type source contact region 214, and p-type gate contact regions 216. Drain contacts 222, field plate contacts 224, gate contacts 226 and a source contact 228 are formed in the PMD to make electrical contact with the n-type drain contact regions 212, field plate 218, p-type gate contact regions 216, and n-type source contact region 214, respectively.

Still referring to FIG. 2, operation of the dual channel JFET in the instant embodiment is similar to operation of the dual channel JFET described in reference to FIG. 1A through FIG. 1G. In the instant embodiment, separation of the n-type source contact region 214 from the p-type gate contact regions 216 by elements of field oxide 206 is advantageous because higher gate voltages may be applied without incurring additional gate leakage current compared to other JFET configurations.

What is claimed is:

1. A dual channel junction field effect transistor (JFET), comprising:
   a p-type semiconductor substrate;
   a deep n-well formed in said p-type semiconductor substrate;
   a plurality of p-wells formed in said deep n-well, such that a first channel is formed between a first p-well of said plurality of p-wells and a bottom surface of said deep n-well and a second channel is formed between said first p-well and a second p-well of said plurality of p-wells, wherein said second p-well is adjacent to said first p-well;
   a plurality of n-well regions formed in said deep n-well in exterior regions to said plurality of p-wells;
   a plurality of n-type drain contact regions formed in said plurality of n-well regions, such that each n-well region of said plurality of n-well regions contains at least one n-type drain contact region of said plurality of n-type drain contact regions; and
   an n-type source contact region formed in said deep n-well between said first p-well and said second p-well.

2. The dual channel JFET of claim 1, further comprising:
   field oxide formed over said deep n-well and said plurality of p-wells; and
   a field plate formed on a top surface of said field oxide over an exterior boundary between said plurality of p-wells and said deep n-well.

3. The dual channel JFET of claim 2, further comprising a plurality of p-type gate contact regions formed in said plurality of p-wells, such that each p-well of said plurality of p-wells contains at least one p-type gate contact region of said plurality of p-type gate contact regions.

4. The dual channel JFET of claim 3, further comprising:
   metal silicide layers formed on top surfaces of said plurality of n-type drain contact regions;
   metal silicide layers formed on top surfaces of said plurality of p-type gate contact regions; and
   a metal silicide layer formed on a top surface of said n-type source contact region.

5. The dual channel JFET of claim 4, in which a pinch-off voltage is substantially established by a dopant density in said second channel and a lateral width of said second channel.

6. The dual channel JFET of claim 5, in which a maximum drain potential is substantially established by a dopant density in said deep n-well, a lateral width of said p-wells and a lateral separation of said p-wells from said n-wells.

7. An integrated circuit, comprising:
   a p-type semiconductor substrate;
   a first dual channel JFET formed in said p-type semiconductor substrate, further comprising:
      a deep n-well formed in said p-type semiconductor substrate;
      a first plurality of p-wells formed in said deep n-well, such that a first channel is formed between a first p-well of said first plurality of p-wells and a bottom surface of said deep n-well and a second channel is formed between said first p-well and a second, adjacent p-well;
      a first plurality of n-well regions formed in said deep n-well in exterior regions to said first plurality of p-wells;
      a first plurality of n-type drain contact regions formed in said first plurality of n-well regions, such that each n-well region of said first plurality of n-well regions contains at least one said n-type drain contact region of said first plurality of n-type drain contact regions;
      an n-type source contact region formed in said deep n-well between said first p-well and said second, adjacent p-well; and
      a first plurality of p-type gate contact regions formed in said plurality of p-wells, such that each p-well of said first plurality of p-wells contains at least one said p-type gate contact region of said first plurality of p-type gate contact regions.

8. The integrated circuit of claim 7, in which said dual channel JFET further comprises:
   field oxide formed over said deep n-well and said first plurality of p-wells; and
   a field plate formed on a top surface of said field oxide over an exterior boundary between said first plurality of p-wells and said deep n-well.

9. The integrated circuit of claim 8, in which said dual channel JFET further comprises:
   metal silicide layers formed on top surfaces of said first plurality of n-type drain contact regions;
   metal silicide layers formed on top surfaces of said first plurality of p-type gate contact regions; and
   a metal silicide layer formed on a top surface of said n-type source contact region.

10. The integrated circuit of claim 9, in which a pinch-off voltage of said dual channel JFET is substantially established by a dopant density in said second channel and a lateral width of said second channel.

11. The integrated circuit of claim 10, in which a maximum drain potential of said dual channel JFET is substantially established by a dopant density in said deep n-well, lateral widths of said first p-well and said second, adjacent p-well, and a lateral separation of said first plurality of p-wells from said first plurality of n-wells.

12. The integrated circuit of claim 11, further comprising:
   a second dual channel JFET formed in said p-type semiconductor substrate, further comprising:
      a second deep n-well formed in said p-type semiconductor substrate;
      a second plurality of p-wells formed in said second deep n-well, said second plurality of p-wells comprising a third p-well and a fourth p-well adjacent to said third p-well, such that:
         a lateral separation between said third p-well and said fourth p-well of said second plurality of p-wells is different from a lateral separation between said first p-well and said second p-well of said first plurality of p-wells;
         a third channel is formed between said third p-well and a bottom surface of said second deep n-well; and
         a fourth channel is formed between said third p-well and said fourth p-well;
      a second plurality of n-well regions formed in said second deep n-well in exterior regions to said second plurality of p-wells;
      a second plurality of n-type drain contact regions formed in said second plurality of n-well regions, such that each n-well region of said second plurality of n-well regions contains at least one said n-type drain contact region of said second plurality of n-type drain contact regions;
      a second n-type source contact region formed in said second deep n-well between said third p-well and said fourth p-well; and
      a second plurality of p-type gate contact regions formed in said second plurality of p-wells, such that each p-well of said second plurality of p-wells contains at least one said p-type gate contact region of said second plurality of p-type gate contact regions.

13. The integrated circuit of claim 12, further comprising:
   a third dual channel JFET formed in said p-type semiconductor substrate, further comprising:
      a third deep n-well formed in said p-type semiconductor substrate;
      a third plurality of p-wells formed in said third deep n-well, said third plurality of p-wells comprising a fifth p-well and a sixth p-well adjacent to said fifth p-well, such that:
         a lateral width of said fifth p-well and said sixth p-well is different from a lateral width of said first p-well and said second p-well;
         a fifth channel is formed between said fifth p-well and a bottom surface of said third deep n-well; and
         a sixth channel is formed between said fifth p-well and said sixth p-well;
      a third plurality of n-well regions formed in said third deep n-well in exterior regions to said third plurality of p-wells;
      a third plurality of n-type drain contact regions formed in said third plurality of n-well regions, such that each n-well region of said third plurality of n-well regions contains at least one said n-type drain contact region of said third plurality of n-type drain contact regions;
      a third n-type source contact region formed in said third deep n-well between said fifth p-well and said sixth p-well; and
      a third plurality of p-type gate contact regions formed in said third plurality of p-wells, such that each p-well of said third plurality of p-wells contains at least one said p-type gate contact region of said third plurality of p-type gate contact regions.

14. A method of forming an integrated circuit, comprising the steps of:
   providing a p-type semiconductor substrate;
   forming a first dual channel JFET in said p-type semiconductor substrate, by a process further comprising the steps of:
      forming a deep n-well in said p-type semiconductor substrate;
      forming a first plurality of p-wells in said deep n-well, such that a first channel is formed between a first p-well of said first plurality of p-wells and a bottom surface of said deep n-well and a second channel is formed between said first p-well and a second, adjacent p-well;
      forming a first plurality of n-well regions in said deep n-well in exterior regions to said first plurality of p-wells;
      forming a first plurality of n-type drain contact regions in said first plurality of n-well regions, such that each n-well region of said first plurality of n-well regions contains at least one said n-type drain contact region of said first plurality of n-type drain contact regions;
      forming an n-type source contact region in said deep n-well between said adjacent p-wells; and
      forming a first plurality of p-type gate contact regions in said plurality of p-wells, such that each p-well of said first plurality of p-wells contains at least one said p-type gate contact region of said first plurality of p-type gate contact regions.

15. The method of claim 14, in which said step of forming a first dual channel JFET further comprises the steps of:
   forming field oxide over said deep n-well and said first plurality of p-wells; and
   forming a field plate on a top surface of said field oxide over an exterior boundary between said first plurality of p-wells and said deep n-well.

16. The method of claim 15, in which said step of forming a first dual channel JFET further comprises the steps of:

forming metal silicide layers on top surfaces of said first plurality of n-type drain contact regions;

forming metal silicide layers on top surfaces of said first plurality of p-type gate contact regions; and forming a metal silicide layer on a top surface of said n-type source contact region.

17. The method of claim 16, further comprising the step of forming a second dual channel JFET in said p-type semiconductor substrate, by a process further comprising the steps of:

forming a second deep n-well in said p-type semiconductor substrate;

forming a second plurality of p-wells in said second deep n-well, said second plurality of p-wells comprising a third p-well and a fourth p-well adjacent to said third p-well, such that:

a lateral separation between said third p-well and said fourth p-well of said second plurality of p-wells is different from a lateral separation between said first p-well and said second p-well of said first plurality of p-wells;

a third channel is formed between said third p-well and a bottom surface of said second deep n-well; and a fourth channel is formed between said third p-well and said fourth p-well;

forming a second plurality of n-well regions in said second deep n-well in exterior regions to said second plurality of p-wells;

forming a second plurality of n-type drain contact regions in said second plurality of n-well regions, such that each n-well region of said second plurality of n-well regions contains at least one said n-type drain contact region of said second plurality of n-type drain contact regions;

forming a second n-type source contact region in said second deep n-well between said third p-well and said fourth p-well; and forming a second plurality of p-type gate contact regions in said second plurality of p-wells, such that each p-well of said second plurality of p-wells contains at least one said p-type gate contact region of said second plurality of p-type gate contact regions.

18. The method of claim 17, further comprising the step of forming a third dual channel JFET in said p-type semiconductor substrate, by a process further comprising the steps of:

forming a third deep n-well in said p-type semiconductor substrate;

forming a third plurality of p-wells in said third deep n-well, said third plurality of p-wells comprising a fifth p-well and a sixth p-well adjacent to said fifth p-well, such that:

a lateral width of said fifth p-well and said sixth p-well is different from a lateral width of said first p-well and said second p-well;

a fifth channel is formed between said fifth p-well and a bottom surface of said third deep n-well; and a sixth channel is formed between said fifth p-well and said sixth p-well;

forming a third plurality of n-well regions in said third deep n-well in exterior regions to said third plurality of p-wells;

forming a third plurality of n-type drain contact regions in said third plurality of n-well regions, such that each n-well region of said third plurality of n-well regions contains at least one said n-type drain contact region of said third plurality of n-type drain contact regions;

forming a third n-type source contact region in said third deep n-well between said fifth p-well and said sixth p-well; and forming a third plurality of p-type gate contact regions in said third plurality of p-wells, such that each p-well of said third plurality of p-wells contains at least one said p-type gate contact region of said third plurality of p-type gate contact regions.

* * * * *